United States Patent [19]

Park et al.

[11] Patent Number: 4,998,712

[45] Date of Patent: Mar. 12, 1991

[54] PRINTED WIRING BOARD FIXTURE APPARATUS

[75] Inventors: Joon Park, Glendale; Stanley Taketani, Garden Grove; Han C. Leung, Los Angeles; George Pelzman, El Segundo, all of Calif.

[73] Assignee: Hughes Aircraft Company, Los Angeles, Calif.

[21] Appl. No.: 502,374

[22] Filed: Mar. 30, 1990

[51] Int. Cl.$^5$ ............................................. B23Q 3/18
[52] U.S. Cl. ....................................... 269/25; 269/71; 269/152
[58] Field of Search ................. 269/45, 903, 156, 296, 269/91-94, 20, 21, 13, 14, 152, 154, 25, 32; 29/741

[56] References Cited

U.S. PATENT DOCUMENTS

| | | | |
|---|---|---|---|
| 3,395,439 | 8/1968 | Palesi et al. | 269/296 |
| 3,775,644 | 11/1973 | Cotner et al. | 269/903 |
| 3,883,128 | 5/1975 | Breese | 269/45 |
| 4,189,230 | 2/1980 | Zasio | 269/903 |
| 4,473,455 | 9/1984 | Dean | 269/903 |
| 4,548,392 | 10/1985 | Rickling | 269/296 |
| 4,573,263 | 3/1986 | Rossi | 29/741 |
| 4,877,228 | 10/1989 | Ripert | 269/156 |

Primary Examiner—Robert C. Watson
Attorney, Agent, or Firm—Leonard A. Alkov; W. K. Denson-Low

[57] ABSTRACT

The base (12) of the fixture apparatus carries four fingers (22)–(28) which define the top plane of the printed wiring board (14). The fingers move out of active position to permit placement of the board in a frame (16). The frame rests on lifter assemblies (46–52) which raise the printed wiring board into contact with the fingers.

29 Claims, 5 Drawing Sheets

PRINTED WIRING BOARD FIXTURE APPARATUS

FIELD OF THE INVENTION

This invention is directed to a fixture apparatus which positions and grasps a printed wiring board frame, in turn carries thereon a printed wiring board onto which components are to be assembled. Position reference is made to the printed wiring board.

BACKGROUND OF THE INVENTION

Printed wiring boards vary in thickness due to manufacturing tolerances, and the etched wiring thereon varies in lateral positioning due to changes in board dimensions. Furthermore, robotic manipulators cannot directly handle the printed wiring board because of its shape and the danger of damage to the components thereon. Therefore, it is desirable to provide a frame for the printed wiring board to aid in its handling and positioning of the printed wiring board. The fixture holds the frame, but refers to the printed wiring board for positioning so that the frame is not relied upon for printed wiring board location.

SUMMARY OF THE INVENTION

In order to aid in the understanding of this invention, it can be stated in essentially summary form that it is directed to a frame for holding a printed wiring board and a fixture apparatus which engages the frame and positions the printed wiring board. Top fingers move in over the printed wiring board, and lifter assemblies raise the printed wiring board to contact under the fingers. Lights mounted on the fixture apparatus are seen through tooling holes in the printed wiring board to move the frame to correctly laterally locate the printed wiring board.

It is thus a purpose and advantage of this invention to provide a printed wiring board fixture apparatus which can receive a printed wiring board holder with a printed wiring board therein so as to quickly and accurately locate the printed wiring board.

It is a further purpose and advantage of this invention to provide a holder for a printed wiring board so that a mechanical robotic manipulator can handle the holder and position it and the printed wiring board carried thereon without danger of damage to the printed wiring board or components thereon.

It is a further purpose and advantage of this invention to provide a printed wiring board fixture apparatus wherein different holders can be employed in the same fixture apparatus so that different holders can retain different printed wiring boards, but can utilize the same fixture apparatus for positioning the printed wiring board in the assembly machine.

It is another purpose and advantage of this invention to provide a printed wiring board fixture apparatus which can receive a printed wiring board in a holder and to achieve alignment of the printed wiring board without operator assistance.

It is another purpose and advantage of this invention to provide a printed wiring board fixture apparatus wherein handling and positioning problems are solved with a cost saving as compared to prior handling methods and apparatus.

Other purposes and advantages of this invention will become apparent from a study of the following portion of this specification, the claims and the attached drawings wherein:

DESCRIPTION OF THE PREFERRED EMBODIMENT

Figure 1:
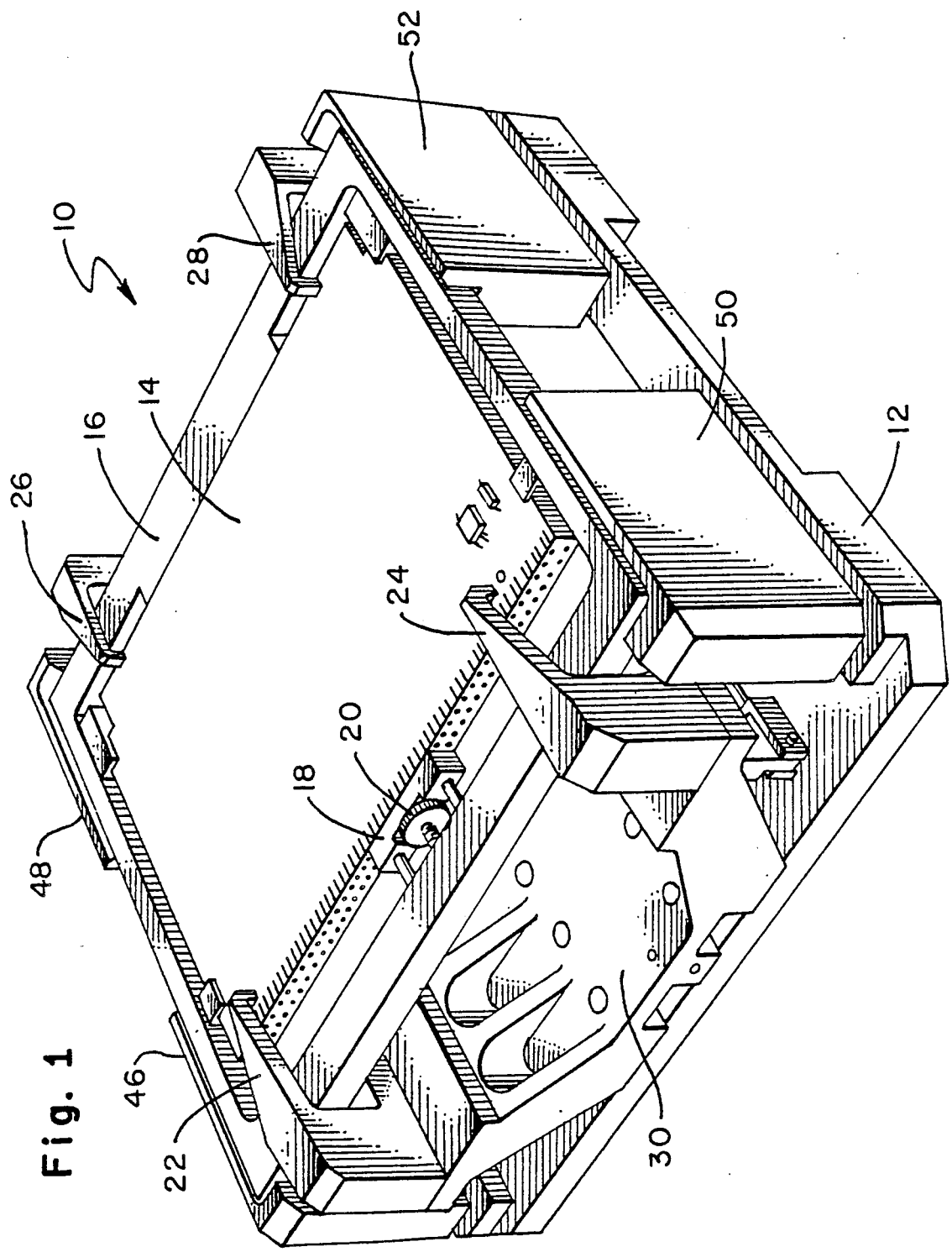
FIG. 1 is a perspective view of the printed wiring board fixture apparatus of this invention shown in a position where it holds and retains a printed wiring board holder with a printed wiring board thereon.

The printed wiring board fixture apparatus of this invention is generally indicated at 10 in FIGS. 1, 2, 3 and 4. The apparatus 10 has a base 12 which is preferably attached to an X-Y table. The apparatus 10 is for the accurate positioning of a printed wiring board. Since printed wiring boards vary in thickness, for the accurate positioning thereof, reference is made to the top surface of the board. FIG. 1 shows printed wiring board 14. The printed wiring board is secured within an open, centered rectangular frame 16 and may be secured in place within the frame by means of clamp 18, which is tightened against the printed wiring board 14 by means of jackscrew 20.

Figure 7:
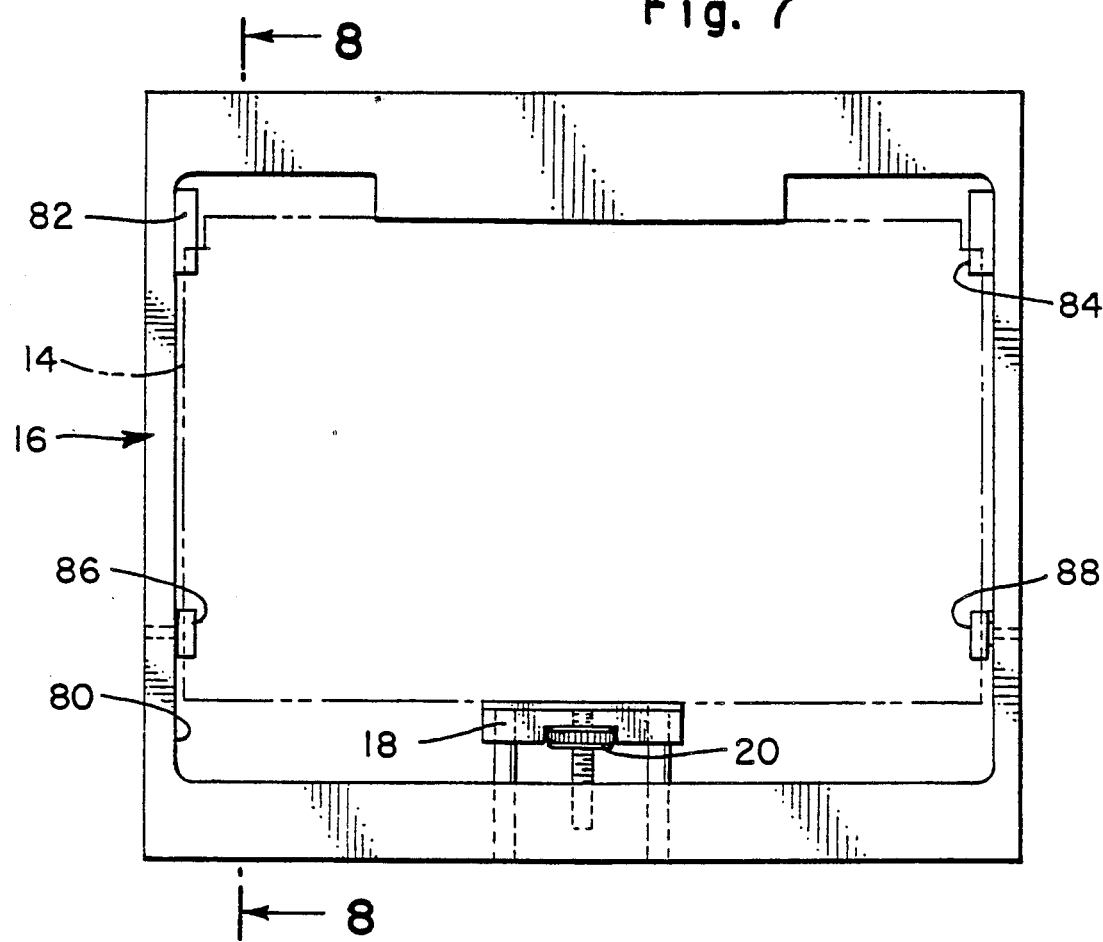
FIG. 7 is a plan view of the frame for holding the printed wiring board in the fixture apparatus of this invention.
Figure 8:
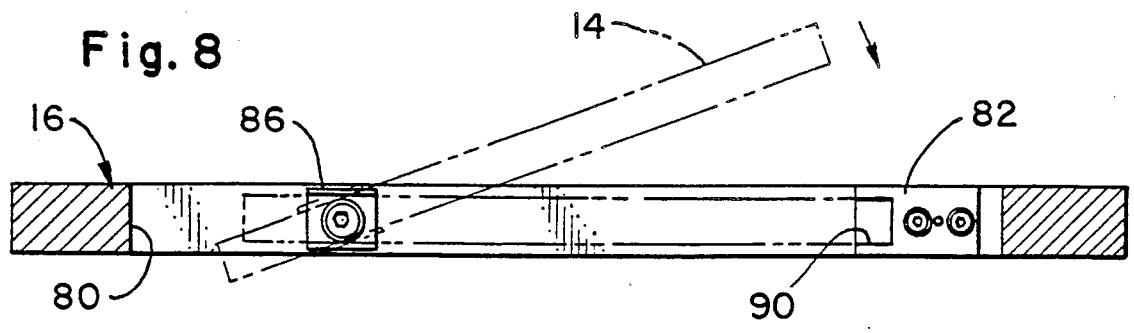
FIG. 8 is an enlarged section taken generally along the line 8—8 of FIG. 7.

Frame 16 is shown in more detail in FIGS. 7 and 8. It has an interior rectangular opening 80 in which the printed wiring board 14 is inserted. As seen in FIG. 7, the interior opening in the frame has therein fixed stops 82 and 84 and pivoted guides 86 and 88. As seen in FIG. 8, the pivoted guides are U-shaped to receive between the arms of the U the thickness of the printed wiring board 14. The pivoted guides can be rotated so that the printed wiring board is inserted within the arms of the guides at a low angle, such as shown in FIG. 8. The printed wiring board 14 is swung downwardly to lie within the plane of the frame and, thereupon slid into the recess 9 of the fixed stop. In this way, the printed wiring board 14 is constrained by its edges. Clamp 18 is advanced by means of its jackscrew 20 to hold the printed wiring board in position in the recess 90 of the fixed stops 82 and 84. The printed wiring board 14 is, thus, positioned. The frame 16 is located within the fixture apparatus, as is described below.

Figure 5:
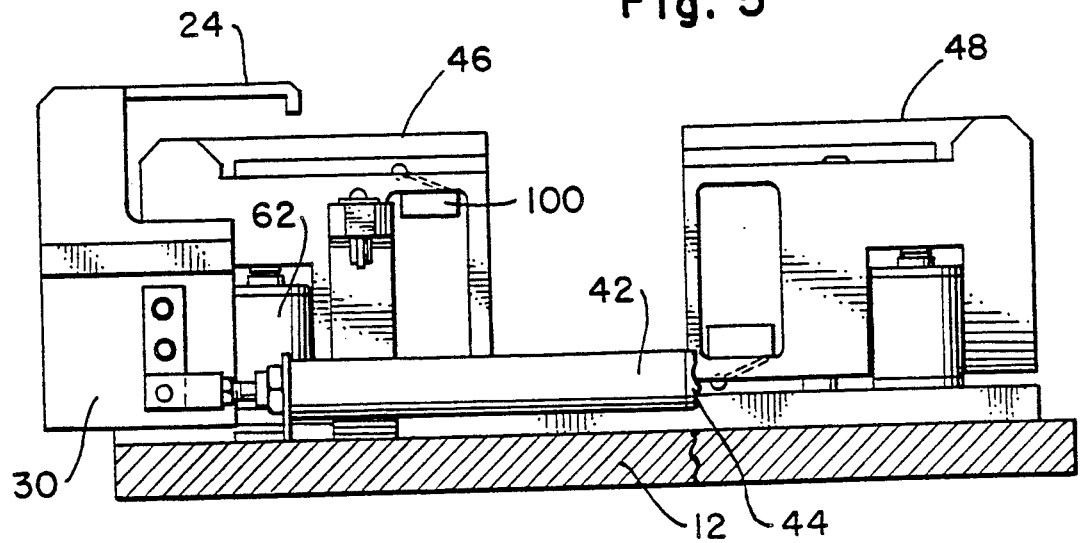
FIG. 5 is a section taken generally along line 5—5 of FIG. 3.
Figure 6:
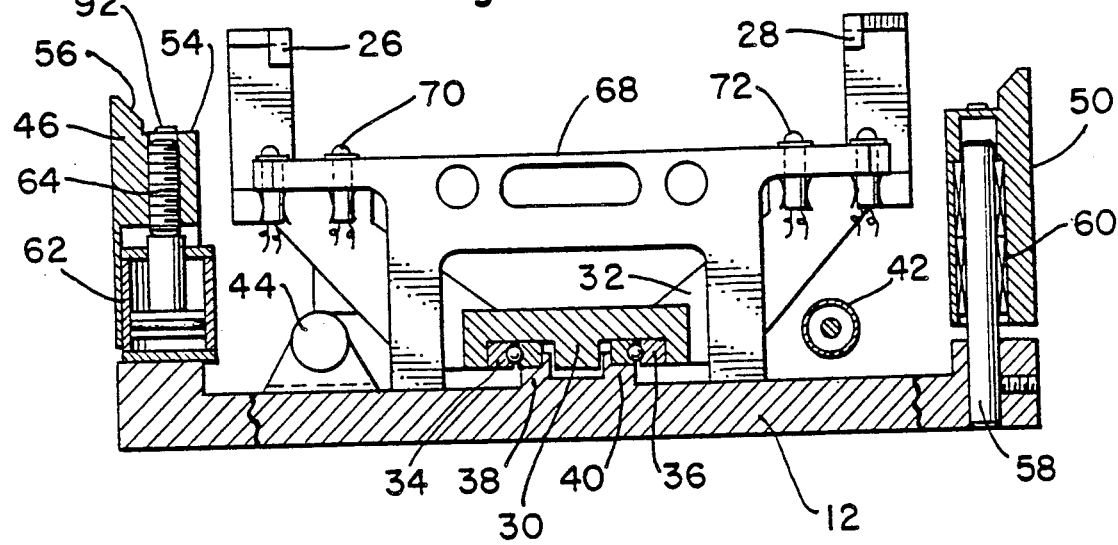
FIG. 6 is a section taken generally along line 6—6 of FIG. 3.

In order to position the printed wiring board with respect to its top surface, fingers 22, 24, 26 and 28 are provided. The fingers are of U-shaped configuration with fingers 22 and 24 mounted on carriage 30. Fingers 26 and 28 are mounted on carriage 32. The carriages 30 and 32 are identical, and the section through the lower part of the carriage is shown in FIG. 6. In FIG. 6, it is seen that carriage 30 is mounted for linear motion on ball guides 34 and 36. The ball guides are parallel to each other for linear guidance of the carriage 30 with its fingers 22 and 24. The carriage 32 is mounted on similar ball guides which are mounted on the same flanges 38 and 40 so that the carriages move toward and away from each other on the same center line. Air cylinder 42 is connected between the base and carriage 30, see FIGS. 2, 3, 4, 5 and 6. Similarly, air cylinder 44 is connected between base 12 and carriage 32, as seen in FIGS. 2, 3, 4 and 6. While air cylinders are recited as being the motive means, it is clear that other motive means can alternatively be employed.

Figure 2:
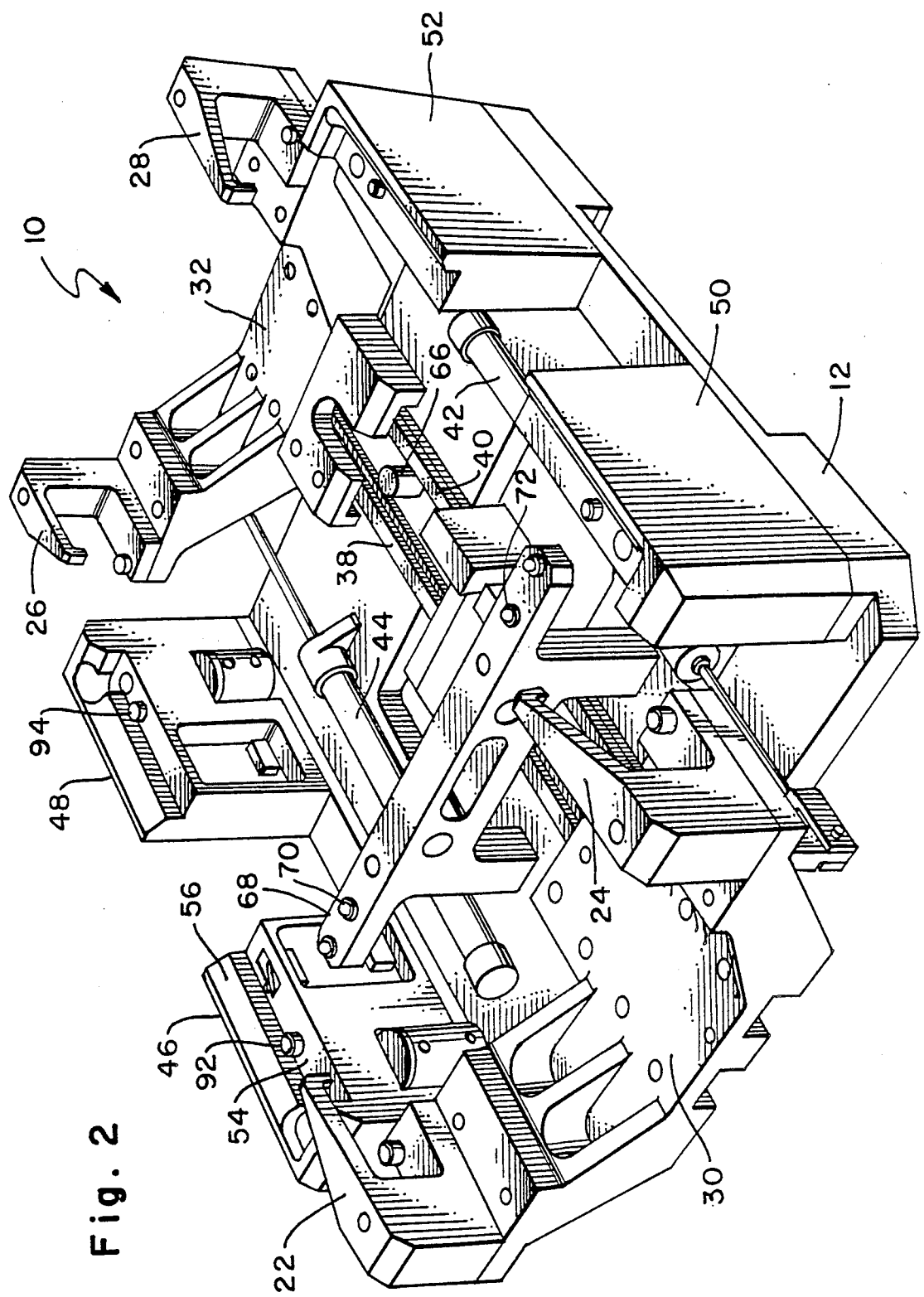
FIG. 2 is a similar perspective view showing the fixture apparatus in the open position wherein it is ready to receive a printed wiring board holder.
Figure 3:
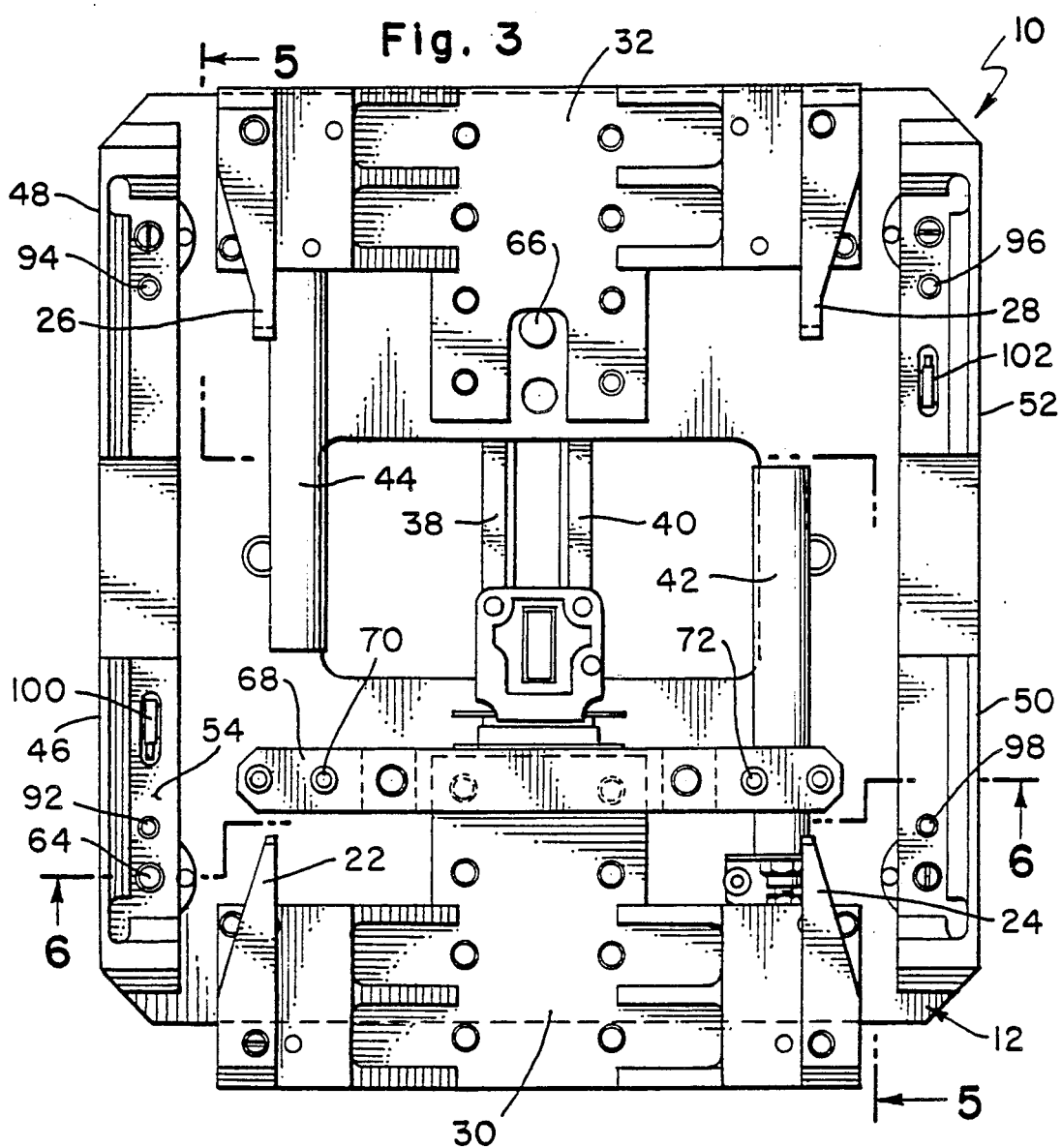
FIG. 3 is a plan view of the fixture apparatus with the movable parts therein in the printed wiring board holding position.

When the carriages are in the extended position shown in FIG. 2, the fingers are sufficiently separated that the frame 16 can be placed down therebetween. When the carriages are brought together, as shown in FIGS. 1, 3 and 5, the fingers 22-28 extend over the top of the printed wiring board 14 to define a plane for positioning the printed wiring board. Stops limit the inward and outward movement of the carriages and the fingers carried thereby.

Figure 4:
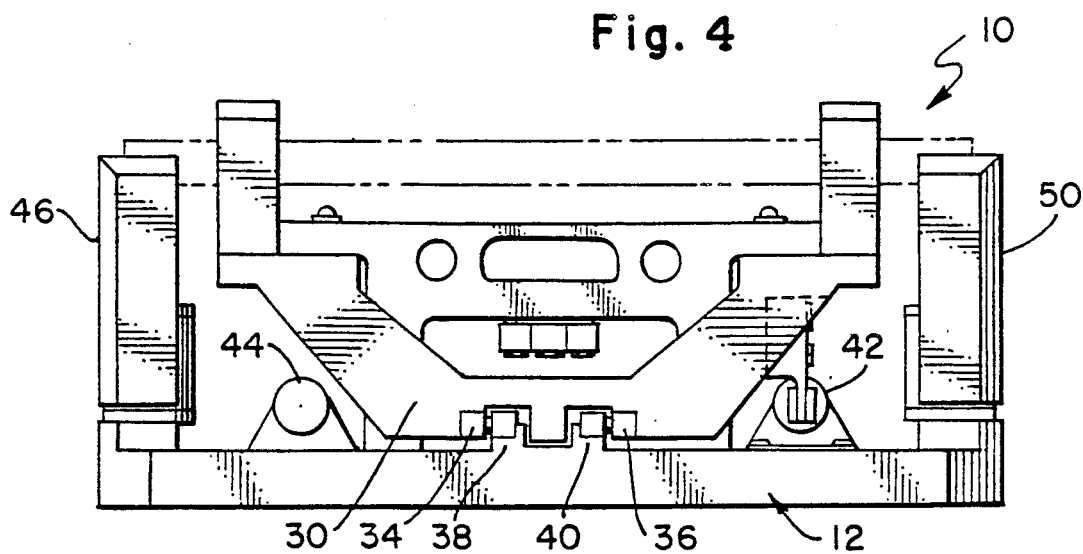
FIG. 4 is a near end view thereof.

Four lifter assemblies are mounted on the base. Lifter assemblies 46, 48, 50 and 52 are shown in FIGS. 1, 2 and 3. Lifter assemblies 46 and 48 are shown in FIG. 5, while lifter assemblies 48 and 50 are shown in FIGS. 4 and 6. As is seen in FIGS. 2 and 3, each of the lifter assemblies is a rectangular structure, and each has a recess to define a corner lip within which rests frame 16. Recess 54 is seen in FIGS. 2 and 6. The upper flange of the recess is beveled at 56 so as to easily receive the frame 16. As is seen in FIGS. 2 and 3, each of the lifter assemblies has a similar recess and a similar bevel. Each of the lifter assemblies is mounted on the base on a linear bearing and upon a jack cylinder. As is seen in FIG. 6, rod 58 is mounted to extend upward from the base. Mounted within lifter assembly 50 and embracing the rod is linear bearing 60. Jack cylinder 62 is mounted upon the base and occupies a pocket within lifter assembly 46, as seen in FIGS. 5 and 6. Adjustment screw 64 engages down through the lifter assembly to engage on top of the piston rod of jack cylinder 62. By adjustment of screw 64, the raised height of the lifter assembly 46 is adjusted. Each of the four lifter assemblies has a jack cylinder, and each has a guide rod thereon so that, when the jack cylinders are energized, the lifter assemblies rise to the extent of cylinder excursion. The lowered position is shown in FIG. 2, and the raised position is shown in FIGS. 1, 4, 5 and 6.

While the adjustment screws on the jack cylinders provide gross adjustment, fine adjustment is provided by set screws in the lifter assemblies upon which the frame 16 rests. Set screw 92 is seen next to the jack cylinder adjustment screw 64 in FIGS. 3 and 6 is also seen in FIG. 2. FIG. 3 also shows set screw 94 in jack assembly 48, set screw 96 in jack assembly 52, and set screw 98 in jack assembly 50. These set screws provide the final adjustment to determine the height of the underside of the frame and, thus, serve as rest stops for the frame. In addition, while observing FIG. 3, it should be noted that the corner lips in the jack assemblies are each L-shaped in two dimensions so as to provide lateral stops as well as vertical stops for the frame 16. FIG. 3 shows switches 100 and 102 which serve to detect the presence of the frame 16. These switches are integrated into the control system so that the lifter assemblies are not raised until the frame is in place. The lifter assemblies carry the frame 16 thereon, and the frame in turn carries the printed wiring board 14 thereon. When the jack cylinders are raised, the printed wiring board comes up into physical contact beneath the fingers 22-28 so as to define the upper position of the board. The board 14 is now raised to a known plane.

The apparatus 10 is configured so as to be useful for a number of different sizes of the frame 16, and the different sizes of frame 16 can respectively hold different sizes of the printed wiring board 14. The width between fingers 22 and 24 can be adjusted by securing the fingers in different bolt holes on the tops of the carriage. These additional bolt holes are seen in FIGS. 2 and 3. Furthermore, the closed dimension between the two carriages 30 and 32 can be adjusted by positioning the stop pins for their inward position at different locations. Stop pin 66 is shown in FIG. 3, and an open hole into which it can be placed is shown below it.

By means of the fixture apparatus 10, a plurality of similar printed wiring boards 14 mounted in their respective frames 16 can be successively held in the apparatus 10 and located with the top surface of the printed wiring boards in the plane defined by the fingers 22-28. This establishes the Z-direction location. However, the X and Y positioning is not accurately accomplished. Each printed wiring board is provided with tooling holes. Light bridge 68 is secured to the base. The light bridge has sufficient span to extend over the base of the carriage, see FIGS. 2 and 6. The light bridge carries at least two lights therein, with lights 70 and 72 being indicated in FIGS. 2 and 3. These lights shine up through the tooling holes in the printed wiring board. The observed position of the tooling holes is fed to the X-Y table position controller. The entire apparatus 10, together with the printed wiring board secured thereon, is moved to the desired X-Y position. Thereupon, electronic components can be automatically installed at various locations in the printed wiring board.

When the assembly is complete, the lifter assemblies are lowered and the fingers are moved out so that the frame 16 together with its printed wiring board 14 can be removed. The frame and the printed wiring board go to the next operation, and a new printed wiring board with its frame is positioned in the recesses in the lifter assemblies. The fingers are moved in, and the lifter assembly is raised to position the new printed wiring board in the reference plane.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A printed wiring board fixture apparatus comprising:
   a base;
   at least four fingers wherein there are fingers comprising a first pair of fingers and a second pair of fingers, said fingers moveably mounted on said base, said fingers being movable from a first, spread position to a second, adjacent position, said fingers defining a plane;
   at least three lifters assemblies mounted on said base, said lifter assemblies being movable on said base from a first, lowered position to a second, raised position;
   mounting means on said lifter assemblies for receiving a printed wiring board holding frame so that the frame may be engaged on said mounting means with said fingers and said lifter assemblies in their first position whereupon said fingers are moved to their second position and said lifter assemblies are moved to their second position to lift the printed wiring board into engagement with said fingers so that the printed wiring board lies with its top surface on said plane; and first and second carriages moveably mounted on said base, said first pair of fingers being mounted on said first carriage and said second pair of fingers being mounted on said second carriage so that motion of said carriages moves said fingers between their first and second positions.

2. The apparatus of claim 1 wherein linear bearings are mounted on said base and said carriages are mounted on said linear bearings.

3. The apparatus of claim 2 wherein said carriages move on the same line toward and away from each other between said first and second positions.

4. The apparatus of claim 3 wherein a first fluid cylinder is mounted between said base and said first carriage and a second fluid cylinder is mounted between said base and said second carriage to respectively move said carriages between their first and second position.

5. The apparatus of claim 1 wherein a guide is mounted on said base for each said lifter assembly, said guides extending substantially parallel to each other and substantially at right angles to the direction of motion of said fingers between their first and second position, said lifter assemblies respectively engaging said guides and moving with respect to said guides from said first to said second position of each said lifter assembly.

6. The apparatus of claim 5 wherein each said guide is an upright rod secured in said base and each said lifter assembly is a linear bearing engaging on said upright rod for motion of said lifter assemblies between their first and second positions.

7. The apparatus of claim 6 wherein a motor is connected between said base and each said lifter assembly to move said lifter assemblies between said first and second position.

8. The apparatus of claim 7 wherein said motor comprises a separate fluid cylinder for each said lifter assembly.

9. The apparatus of claim 8 wherein there are four of said lifter assemblies.

10. The apparatus of claim 9 further including a frame on said mounting means, said frame having printed wiring board engagement means thereon so that a printed wiring board may be carried on said frame and removably positioned on said fixture apparatus by removably placing said frame on said mounting means on said lifter assemblies.

11. The apparatus of claim 1 further including a frame on said mounting means, said frame having printed wiring board engagement means thereon so that a printed wiring board may be carried on said frame and removably positioned on said fixture apparatus by removably placing said frame on said mounting means on said lifter assemblies.

12. The apparatus of claim 9 wherein there are four fingers comprising a first pair of fingers and a second pair of fingers;

first and second carriages movably mounted on said base, said first pair of fingers being mounted on said first carriage and said second pair of fingers being mounted on said second carriage so that motion of said carriages moves said fingers between their first and second positions.

13. The apparatus of claim 12 wherein linear bearings are mounted on said base and said carriages are mounted on said linear bearings.

14. The apparatus of claim 13 wherein said carriages move on the same line toward and away from each other between said first and second positions.

15. The apparatus of claim 14 wherein a first fluid cylinder is mounted between said base and said first carriage and a second fluid cylinder is mounted between said base and said second carriage to respectively move said carriages between their first and second position.

16. The apparatus of claim 6 wherein each said lifter assembly has a recess thereon with a flange defining the outer side of said recess configured so that a frame is engageable in said recesses of said lifter assemblies and retained by said flanges so as to inhibit lateral displacement of a frame.

17. The apparatus of claim 16 further including a frame positioned in said recesses of said lifter assemblies, said frame having an open interior and having printed wiring board guides therein and a clamp to clamp a printed wiring board within said opening in said frame so that said fingers can be engaged by the printed wiring board when said lifter assemblies and said frame are raised.

18. The apparatus of claim 16 wherein there are four of said lifter assemblies and there is a fluid cylinder beneath each said lifter assembly to raise said lifter assembly from said base from said first to said second position, each said lifter assembly being adjustably mounted with respect to its fluid motor to control the height of said lifter assemblies with respect to said base.

19. The apparatus of claim 18 wherein there are four fingers comprising a first pair of fingers and a second pair of fingers;

first and second carriages movably mounted on said base, said first pair of fingers being mounted on said first carriage and said second pair of fingers being mounted on said second carriage so that motion of said carriages moves said fingers between their first and second positions.

20. The apparatus of claim 19 wherein linear bearings are mounted on said base and said carriages are mounted on said linear bearings.

21. The apparatus of claim 20 wherein said carriages move on the same line toward and away from each other between said first and second positions.

22. A fixture apparatus comprising:
a base;
at least first and second lifter assemblies mounted on said base for movement in a first direction from a first, lowered position to a second, raised position, first and second .guides on said base, said first and second lifter assemblies engaging said guides to guide said lifter assemblies in said first direction, motor means interconnected between said base and said lifter assemblies to move said first and second lifter assemblies between said first and second positions, engagement means on said lifter assemblies for receiving a frame which carries a printed wiring board;
at least first and second fingers, said first and second fingers being respectively mounted on first and second carriages, guide means between said carriages and said base for permitting movement of said carriages in a second direction substantially normal to said first direction and permit movement of said carriages from a first, outer position to a second, inner position, said fingers defining a plane when in said second position so that a frame carrying a printed wiring board may be placed on said engagement means on said lifter assemblies while both said fingers and said lifter assemblies are in their first position, henceforth said fingers and said lifter assemblies move to their second position wherein the printed wiring board is in engagement with said fingers so that the printed wiring board lies with its surface in said plane.

23. The apparatus of claim 22 wherein motor means is connected between said first and second carriages and said base for moving said carriages between said first and second positions.

24. The apparatus of claim 23 wherein said motor means and said lifter assembly-raising motors are fluid motors.

25. The apparatus of claim 24 wherein said lifter assembly comprises rods with linear bearings engaging said rods.

26. The apparatus of claim 25 wherein said carriage guide means comprise guideways in line with each other so that said carriages move along the same line.

27. The apparatus of claim 23 further including a light mounted on said base, with said light positioned with respect to said base to shine through a tooling opening in the printed wiring board to permit detection of lateral position of the printed wiring board.

28. The apparatus of claim 27 wherein there are two said lights mounted on said base for shining through two tooling holes in the printed wiring board to determine location of the printed wiring board.

29. The apparatus of claim 22 further including a frame, mounting means on said frame for carrying a printed wiring board on said frame, said mounting means including at least two stops and at least one clamp for clamping the printed wiring board against said stop so that a printed wiring board is firmly positioned within said frame and said frame is firmly positioned within said apparatus.

* * * * *